United States Patent [19]

Shah et al.

[11] Patent Number: 4,759,073
[45] Date of Patent: Jul. 19, 1988

[54] BONDING APPARATUS WITH MEANS AND METHOD FOR AUTOMATIC CALIBRATION USING PATTERN RECOGNITION

[75] Inventors: Gautam N. Shah, Warrington; Mark B. Soffa, Philadelphia; Mansur F. Pagdiwala; Thomas F. Schueller, both of Warrington; George M. Berkin, Yardley; Asuri S. Raghavan, Warrington, all of Pa.

[73] Assignee: Kulicke & Soffa Industries, Inc., Horsham, Pa.

[21] Appl. No.: 798,685

[22] Filed: Nov. 15, 1985

[51] Int. Cl.⁴ ............................................. G06K 9/32
[52] U.S. Cl. ................................... 382/8; 29/407; 228/4.5; 228/103; 228/179; 358/101; 382/46
[58] Field of Search ...................... 382/8, 44, 45, 46; 358/101, 106, 107; 228/4.5, 7, 12, 103, 179; 29/407

[56] References Cited

U.S. PATENT DOCUMENTS

| | | | |
|---|---|---|---|
| 3,986,007 | 10/1976 | Ruoff, Jr. | 358/101 |
| 4,239,144 | 12/1980 | Elles et al. | 228/4.5 |
| 4,325,077 | 4/1982 | Dunham | 382/8 |
| 4,361,261 | 11/1982 | Elles et al. | 228/103 |
| 4,390,955 | 6/1983 | Arimura | 358/101 |
| 4,593,406 | 6/1986 | Stone | 382/8 |

FOREIGN PATENT DOCUMENTS

| | | |
|---|---|---|
| 51-78174 | 7/1976 | Japan . |
| 52-96868 | 8/1977 | Japan . |
| 53-63868 | 6/1978 | Japan . |
| 57-71141 | 5/1982 | Japan . |

Primary Examiner—Leo H. Boudreau
Attorney, Agent, or Firm—Woodcock Washburn, Kurtz Mackiewicz & Norris

[57] ABSTRACT

A wire bonding apparatus and method incorporating a pattern recognition system wherein there is stored, in a teach mode, signatures representing a pre-determined point on a chip to be bonded, the signatures being obtained at respective 90° locations of the pedestal which carries the chip. Automatic re-calibration provides for rotating the pedestal to each of four 90° apart spaced angles and finding the respective recorded signatures and the corresponding positions, and calculating the true center of rotation as a function of the four positions thus found. A specialized algorithm is used for correcting error which may be introduced if the chip is not rotated at precisely 90° intervals during the process of finding the respective signatures. The system carries out re-calibration automatically every N packages bonded.

18 Claims, 5 Drawing Sheets

BONDING APPARATUS WITH MEANS AND METHOD FOR AUTOMATIC CALIBRATION USING PATTERN RECOGNITION

BACKGROUND OF THE INVENTION

This invention relates to automated apparatus and methods for calibrating wire bonding apparatus and, more particularly, to wedge bonding systems which utilize pattern recognition for calibrating the stored coordinates of the center of rotation of the pedestal which carries a chip-containing package to be bonded.

In the prior art, integrated circuit chips are known to be electrically coupled to lead frames by wire bonding apparatus which bonds wires from a plurality of chip pads to corresponding beams or leads on a lead frame with which the chip is packaged.

As the circuit density of integrated circuit chips has increased, the accurate positioning of a wire bonding head utilized in automatic wire bonding apparatus to form wire bonds between chip pads and leads has been more difficult and has required more complex and sophisticated design. U.S. Pat. No. 4,441,205, Berkin et al, assigned to be assignee of the present invention, discloses a pattern recognition system which provides a successful solution to the problem of locating the chip so that the wire bonding head can the accurately positioned with respect to the chip. Further, co-pending U.S. application Ser. No. 735,839 Raghavan et al, entitled "Video Bond Lead Locator", and assigned to the same assignee, provides a solution to the problem of precisely determining the location of the leads of an integrated circuit chip lead frame so that the wires may be bonded to those leads without error which can otherwise result from failing to distinguish leads from specular reflection originating in the lead frame package.

However, in wire bonding apparatus of the type referred to as a wedge bonding system there has existed a persistent problem which has only been dealt with manually in the past, causing significant operating down time and reduction of throughput, and for which there exists a need for an automatic solution. In such systems, all bonding is done along a defined axis, e.g., along the Y axis of the field of movement of the bonding head. In the wedge bonding operation the thin wire, in the range of 0.7 to 3.0 mils and typically about 1.25 mils, must not be twisted or rotated. For this reason, the bonding head is constrained to move on a straight line while the work piece is rotated relative to it. Thus, for each successive bonding step the pedestal holding the work piece, or package containing the chip, is rotated by a pre-determined angle so that the chip pad and lead which are to be bonded lie on the Y axis along which the bonding head is allowed to move. Since the apparatus must tell the bonding head exactly where each pad is located, the apparatus must have very precise information about the location of the center of rotation of the pedestal. In a commercial bonder of the assignee, the pedestal rotation is referred to as theta motion. Note that in apparatus of this sort, as taught in the above-referenced Berkin et al patent, it is possible to determine quite accurately the location of a chip with respect to a reference point, such that if the actual center of rotation is also known, then all necessary information is on hand in order to determine the location of the bonding pad and lead pad after theta motion of a pre-determined amount.

Generally, in prior art operation of such wedge bonding apparatus, the real center of rotation is determined at the beginning of a run. It is stored in the memory of the apparatus control system, and is used thereafter until there is operator detection of slippage in locating the proper bonding positions. A problem which arises to cause such slippage is that the real center of rotation is displaced with respect to the system XY reference and bonding head due to thermal drift and other effects in the system. These systems contain substantial amounts of metal in order to absorb the rapid motions that are involved, as well as substantial linkages for driving the bonding head and the pedestal. It has been observed that following start-up of such an apparatus, the temperature rises and in fact the temperature of much of the metal in the apparatus changes substantially, causing the aforesaid thermal drift of the pedestal relative to the bonding head, such that the stored coordinates of the center of rotation come into error.

We have determined that when the actual center of rotation of the pedestal, or of the theta motion, differs from the calculated center, a theta rotation of 180° can double the error in the placement of a bond. Consequently, this thermal drift requires possible frequent re-calibration of the bonder to update the software record of the actual center of rotation position during periods of temperature instability. For example, in practice we have found that the center of rotation can drift approximately one mil over a space of about 15 minutes. When non-automatic operator intervention is required to re-calibrate the center of rotation, this involves effective system down time of two-three minutes as frequently as every fifteen minutes, resulting in a significant decrease in throughput. While re-calibration may be required at different rates for different operations, the potential need for operator intervention requires the attendance of an operator for a substantial percentage of system operating time. Clearly, it is preferred to provide automatic re-calibration so as to continuously minimize and control drift, avoid system down time, increase throughput and minimize operator time.

In our approach to a solution to the above problem, we have chosen to utilize the signature generation and finding techniques as set forth in the above-referenced Berkin et al U.S. Pat. No. 4,441,205, which is incorporated herein by reference. The referenced Berkin et al patent discloses a preferred technique for generating a signature, and as used herein a signature may be either a single signature or an orthogonal signature, e.g, X and Y signatures comprising arrays of digital data corresponding to a pre-determined field associated with a given point on the target chip. As is also set forth in the above-referenced Berkin et al patent, a signature is "found" by scanning an area and generating a series of signatures, comparing each generated signature with the referenced signature and determining the minimum comparison difference. It is to be noted that while the signature generating and finding techniques set forth in the Berkin et al patent are preferred, other equivalent forms of signature generation and finding using pattern recognition can be utilized in the apparatus and method of this invention. This invention may use other pattern recognition or image processing systems, and the term signature includes templates and transforms of stored data.

SUMMARY OF THE INVENTION

It is an object of this invention to provide a means and method for calibration correction of a wedge bonding apparatus, the calibration comprising the determination of the actual center of rotation of the pedestal or work piece which carries the package being bonded, and correcting the stored position of such center of rotation.

It is another object of this invention to provide a method utilizing pattern recognition techniques for automatically and periodically determining the center of rotation of a rotatable pedestal in a bonding apparatus which carries the package being bonded.

It is another object of this invention to provide an automatic method of nulling out the effect of thermal drift and other factors on the position of the axis of the pedestal which carries a package being bonded in a wedge bonding system.

It is another object of this invention to provide apparatus which utilizes pattern recognition to automatically adjust the stored location of the axis of rotation of a rotatable element which has drifted in position relative to the apparatus reference system due to thermal effects.

In accordance with the above objects, there is provided a wire bonding apparatus, and a method of calibration of same, which incorporates a pattern recogition system and control means for determining the center of rotation of a rotatable pedestal which carries a package to be wire bonded. The apparatus stores a plurality of signatures, preferably four, representing signatures of a pre-determined point on said package recorded at respective different pedestal angles. During automatic re-calibration, the pedestal rotates to the angle corresponding to each of the stored signatures and the actual position of the signature on the package is found at each rotated angle, following which the four found positions are utilized to calculate the true center of rotation. An additional algorithm is utilized for correcting error in the calculated center of rotation introduced if the chip-carrying package is not rotated precisely 90° during the process of finding each respective signature. Software in the apparatus control system preferably carries out the re-calibration automatically every N packages bonded or after a pre-determined period of time has elapsed.

DESCRIPTION OF THE PREFERRED EMBODIMENTS

Figure 1:
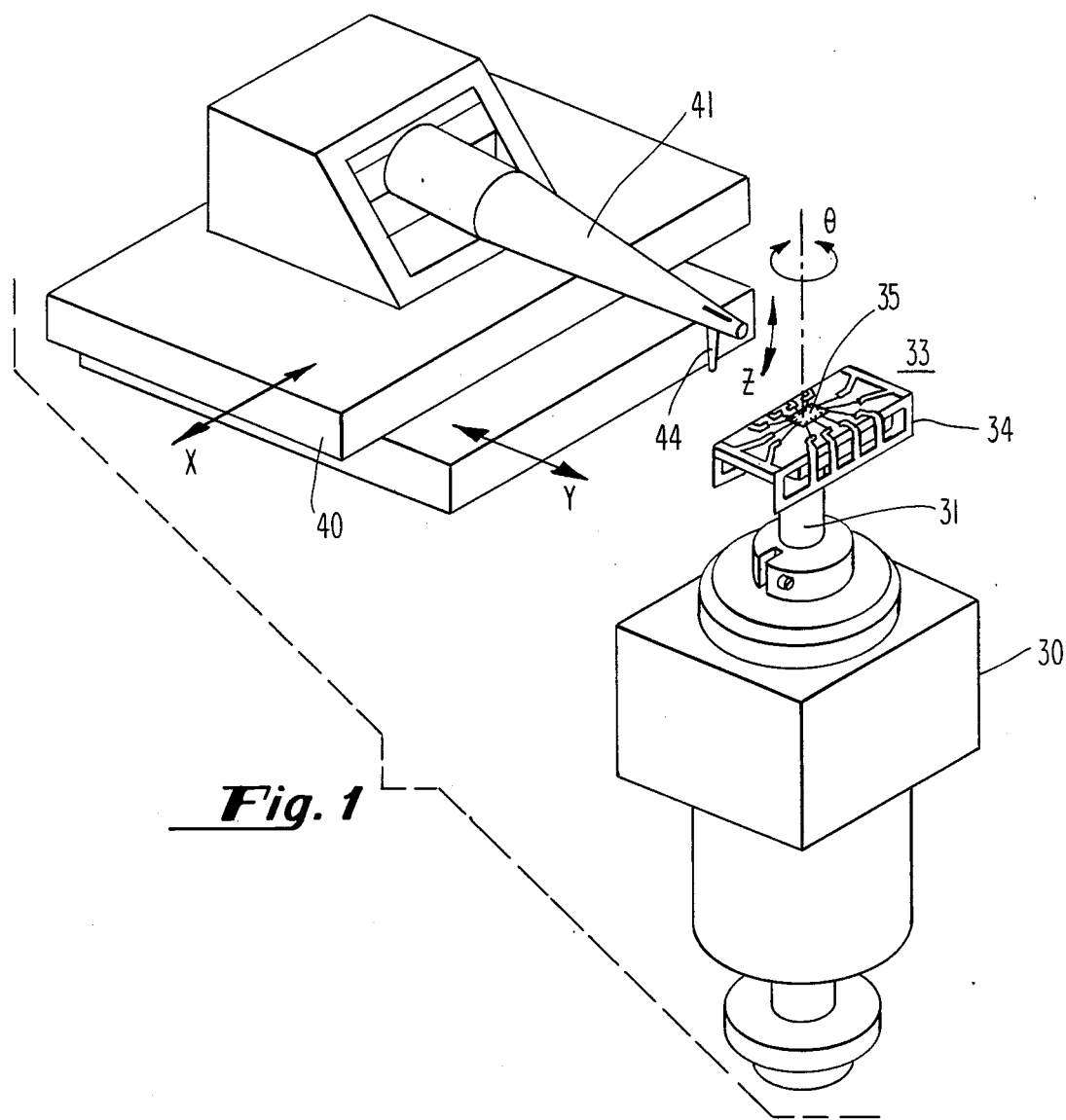
FIG. 1 is a perspective view of the main features of the apparatus embodying the invention of this application.

Referring now to FIG. 1, there is shown a perspective diagrammatic illustration of the main features of a wedge bonding apparatus of the type which utilizes this invention. There is shown schematically a pedestal-carrying structure 30 having a rotatable pedestal 31. Pedestal 31 is rotated by a controller of the type that has been used in the prior art, the details of which are not relevant to the subject invention. The pedestal can be moved in the Z direction to position the package 33 relative to the XY table, but during the bonding operation the pedestal is rotatable only angularly, i.e., in a theta rotational direction as illustrated. The pedestal carries a package 33 comprising lead frame 34 and chip 35 mounted thereon. As used hereinafter, the term "package" shall generally refer to both the lead frame and the chip, but it is to be noted that such term may include differing packages of different configurations, e.g., containing two or more chips. The essential point here is that the package is mounted on a rotatable pedestal for purposes of wedge bonding from a pre-determined chip pad to leads on a lead frame. The package is held onto the pedestal by a suction system as is known in the art.

The other major portion of the apparatus illustrated in FIG. 1 is the XY table, generally illustrated at 40. The XY table carries a wire bonding arm as illustrated at 41, terminating in the actual bonding tool shown at 44. The XY table can be moved in the system XY plane by a XY controller as found in the prior art, the details of which are not relevant to the subject invention. Additionally the bonding tool 44 is movable along the Z axis, so that it can be brought into operative contact with the package when it is located on the pedestal.

In a typical system, packages are fed to the pedestal on a "boat", the pedestal being movable in a Z axis direction so as to lift up the package which is to be wire bonded. The XY table typically has a bonding area of about 1"×1" with a resolution of 0.0001". The XY table has a drive system comprising a closed loop DC servo motor with built in tachometer feedback, and is rotatable about its own theta axis over 360°. The bond head is preferably an ultrasonic low-mass bond head utilizing a phase-locked loop generator, and is adapted for bonding wires in a size range of about 0.0007" to about 0.003". However, the subject invention is not limited in any way to the size of the wire utilized.

Figure 2A:
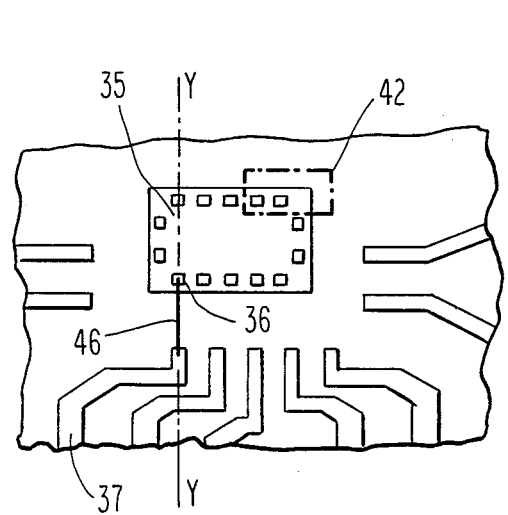
FIGS. 2A and 2B show schematic representations of different theta positions for bonding wires between respective chip pad and lead locations at such different theta postions.
Figure 2B:
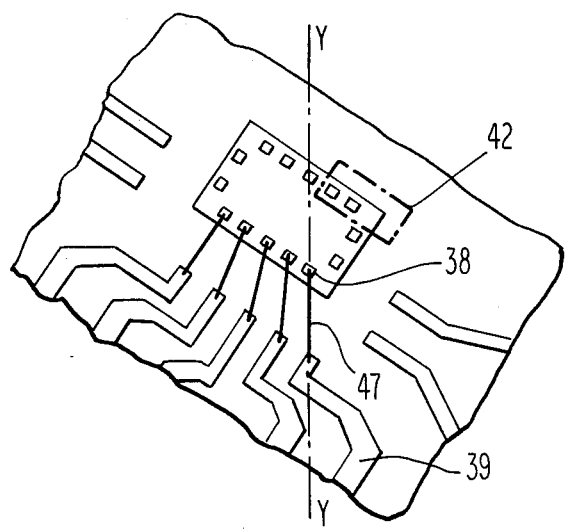

In practice, and referring also to FIGS. 2A and 2B, during the wire bonding operation the pedestal is moved only in the angular or theta direction, so as to permit bonding along the apparatus Y axis. For each wire bonded, the pedestal is moved to the proper theta position for the bonding operation, and the apparatus determines the precise positions of the bonding locations and controls the bonding operation along the system Y axis. For the next bonding step, the pedestal is rotated the precise angle required to bring the next chip pad-lead into alignment with the Y axis, and the bonding operation is repeated in this manner. Thus, FIG. 2A illustrates a first bonding operation wherein a wire 46 is bonded between chip pad 36 and lead 37; FIG. 2B illustrates a latter operation wherein a wire 47 is bonded between chip pad 38 and lead 39. Assuming that the system knows the location of the theta center with respect to the XY reference system, after a given theta rotation the new coordinates of a point on the chip can be found for the XY table reference system. On FIGS. 2A and 2B, area 42 illustrates a typical field of view of the PRS, e.g., for obtaining a signature.

Figure 3:
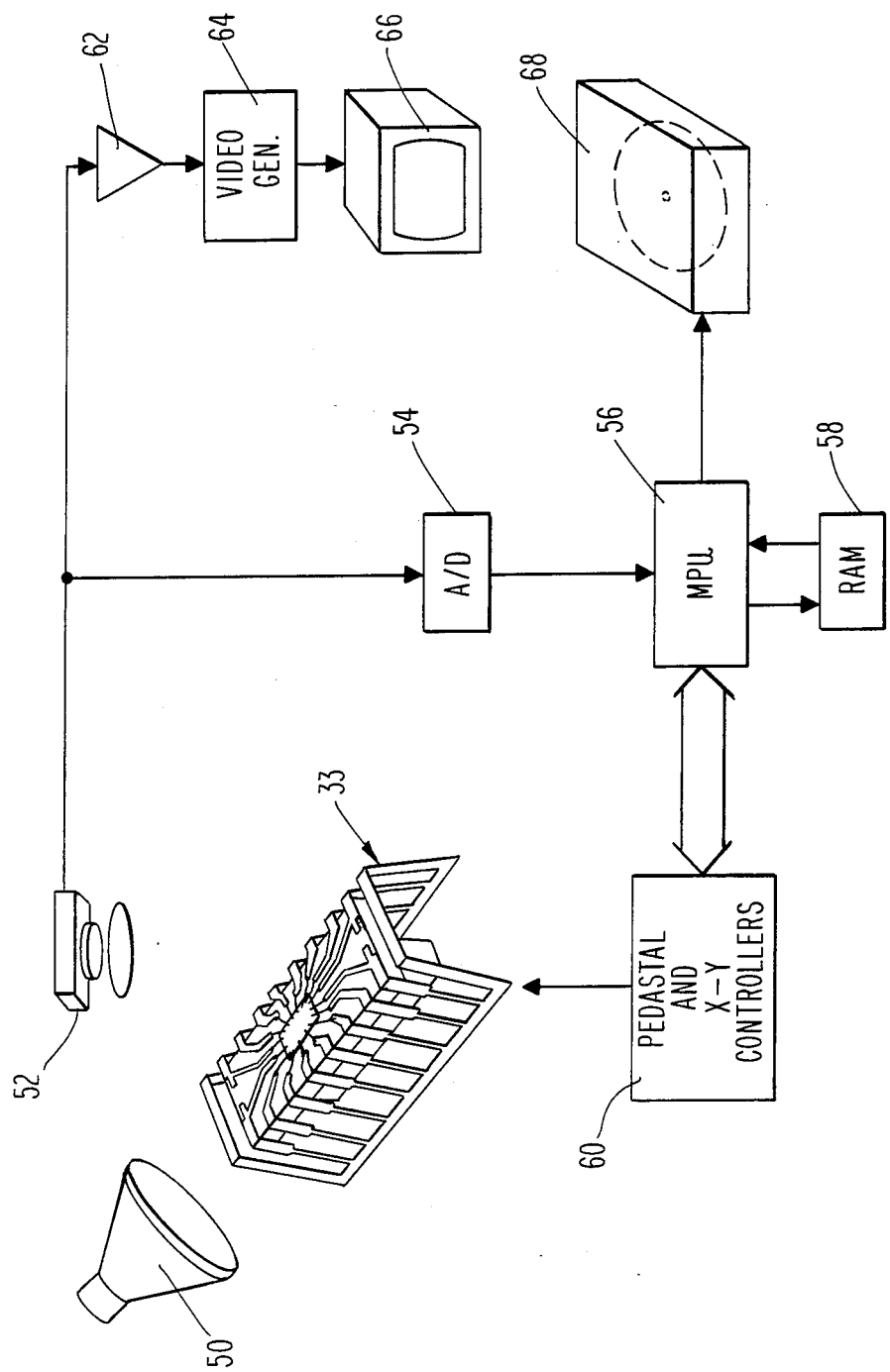
FIG. 3 is a schematic representation of the overall control system of the wire bonding apparatus that incorporates the recalibration invention of this application.

Referring now to FIG. 3, there is shown a schematic representation of the apparatus utilizing the subject invention. The package 33 is shown positioned with respect to a source of light 50 and optical and a camera means 52 which may suitably comprise a video tube, a vidicon, or the like, adapted to sweep rastor-fashion over an area corresponding to the area viewed. The analog signal output by the video device 52 are converted in an analog-to-digital converter 54 to digital representations of the light intensity falling on the camera at corresponding locations, in known fashion. Typically the field of view of the device 52 is focussed on a portion of the chip carried by the package 33, and is divided into an N by M array of square areas on its surface, referred to as picture elements, or "pixels", and a digital number representative of the light intensity or grey level within that area is provided for each of the N×M pixels generated. Thus, for each point on the video target, or chip, there is a specific array of N×M pixels. In a preferred embodiment of the present invention a four-bit word providing sixteen stages of light intensity is used to represent each pixel; the pixels are typically 0.00025" square, i.e., there are four pixels per mil. The digitized samples are supplied to a microprocessor unit 56, supplied with random access memory 58, which supplies signals to the pedestal and XY controllers 60 for controlling those elements with respect to all of their degrees of freedom. Further, as illustrated, a buffer amplifier 62 may also be provided to drive a video generator 64 which supplies a television screen 66 with a picture of what is viewed by the camera 52 to assist in the operator location of the chip with respect to referenced locations during the procedures that are outlined below. The microprocessor may also feed on-line storage means, such as a floppy disk drive shown schematically at 68 for storage of information generated according to the method of the invention, as is discussed in detail below.

Reference is made to U.S. Pat. No. 4,441,205, which is incorporated by reference, for a discussion of the PRS which is utilized in the system and method of this invention. The PRS utilized in connection with this invention provides an electronics capture range of 0.00975". As set forth above, the method of generating and finding signatures corresponding to or associated with specific points, e.g. points on a chip, is described in the referenced 4,441,205 patent, and is not repeated here. For purposes of this disclosure, the term "signature" embraces the type of signature as disclosed in the referenced 4,441,205 patent, or any equivalent group of data which may be recorded in a PRS for identification of a point. Thus, while the preferred PRS for use with this invention utilizes the signatures as disclosed in the referenced 4,441,205 patent, other "signatures" corresponding to video information representative of a position on a chip can be utilized within the scope of this invention. As will be recognized from the disclosure that follows, the signature as used herein comprises data representative of a point on the target chip, or other point on the package, which data uniquely identifies that point, so that the employment of a subsequent scanning process can find the point on the same chip or a similar chip and identify it as being the same point. As set forth in the referenced patent, the PRS technique utilizes the fact that chips have substantially identical geometry, such that the signature corresponding to a point on a first or referenced chip will be found within a suitable degree of accuracy in subsequently processed chips.

Figure 4A:
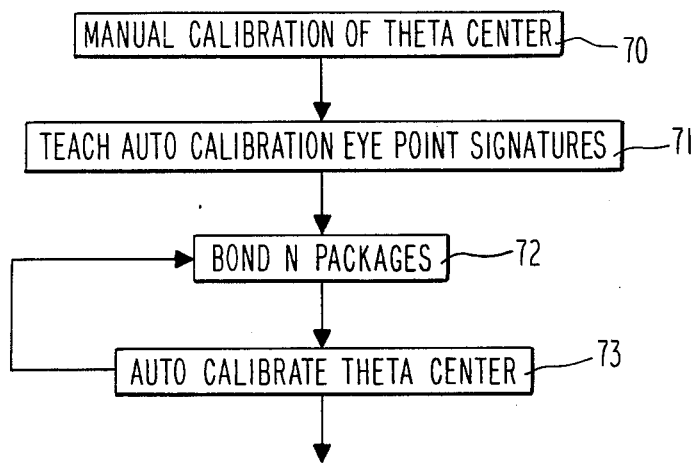
FIG. 4A is an overview flow diagram of the steps of this invention.

Referring now to FIG. 4A, there is shown a block diagram illustrating an overview of the auto calibration method of this invention. As illustrated at 70, first the center of rotation is accurately determined by the operator by manual calibration. After the operator accurately determines the true center of rotation of the pedestal, or theta center, it is stored by inputting it through a keyboard into the apparatus system. Following this, the next step illustrated at 71 is to teach the apparatus the signatures corresponding to "eye points", or signatures corresponding to a predetermined position on the chip for different theta angles. This technique utilizes the PRS of the device in obtaining signatures corresponding to an eye point which has been located at 0, 90, 180 and 270 degree positions First, a single target, or eye point, is chosen by the operator. The signature is then obtained through PRS in the four orientations of the theta axis by rotating the pedestal and moving the XY table to coincide with the rotated target.

With four signatures in storage, the apparatus is utilized for the desired bonding procedure, and as illustrated at step 72, is used to bond N packages in a known manner. It is to be understood that the equivalent of counting a given number of packages is timing out a certain time, time being equal to packages since the throughput has a predetermined rate. During the operation of the machine, heating and other factors cause the mechanical parts to drift as set forth above, resulting in a change of the center of rotation.

In order to find the true center of rotation of the theta axis, the apparatus and method of this invention prescribes finding the location of the four taught points, which means utilizing the PRS to find the four signatures. At step 73, the step of auto calibrating the theta center is performed by rotating the pedestal to the four different angles, and for each rotation moving the XY table to the assumed location and then using the PRS to find the true location of the target. The four locations are used to calculate the center of rotation mathematically, which operation is carried out by microprocessor 56.

Figure 4B:
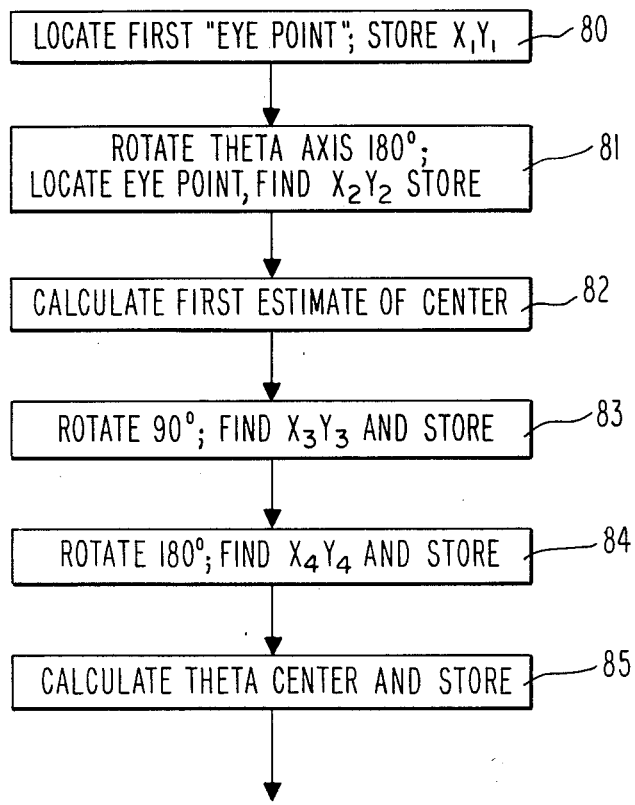
FIG. 4B is a flow diagram of the steps carried out in the teach mode of the re-calibration of this invention.
Figure 4C:
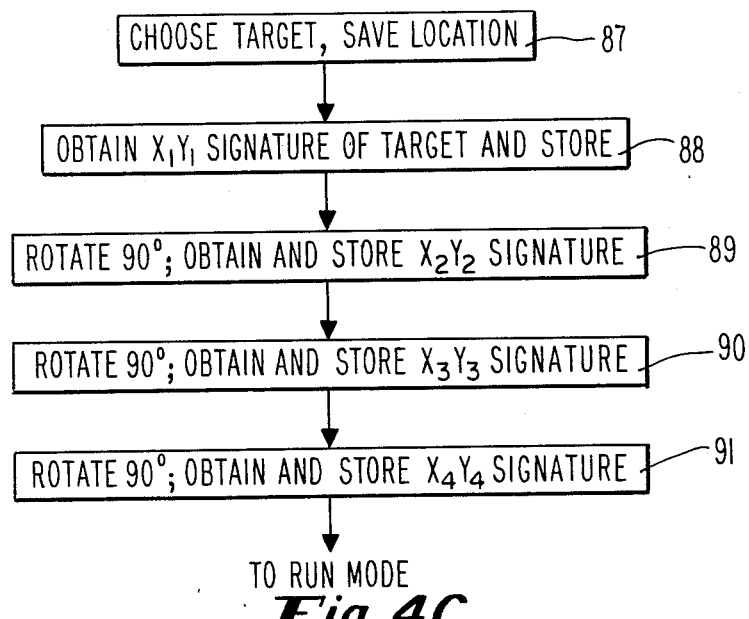
FIG. 4C is a flow diagram of the steps carried out in the automatic re-calibration mode of this invention.

Referring now to FIGS. 4B and 4C, the specific steps of the teach mode portion of the method of this operation are described. The first step of manually determining the theta center is set forth at block 80 of FIG. 4B, and comprises the operator picking a target, e.g., a distinguishable mark on the package (preferably the chip) and storing the position of the first eye point $X_1Y_1$. This coordinate information is stored for later use in calculating the center. Thereafter, as illustrated at 81, the theta axis is rotated 180° and the XY table is positioned automatically at the expected location of the target. The operator then further moves the XY table and uses the optics of the apparatus to determine the exact target location, i.e., locates the eye point and determines the coordinates $X_2Y_2$. The stored values of $X_1Y_1$ and $X_2Y_2$ are utilized to calculate a first estimate of the center, being simply the mid-point. This first estimate of the theta center is utilized in carrying out step 83, which constitutes rotating the pedestal an additional 90°, and again moving the XY table to find $X_3Y_3$ the point with the optics, and storing $X_3Y_3$. As seen at 84, the pedestal is then rotated 180°, and in a like manner the operator determines the location of the eye point and finds and stores $X_4Y_4$. Finally, the theta center is calculated and stored at 85, utilizing the four 90° points which have been determined. This calculation may comprise getting the midpoints of the two opposed pairs of points, and averaging. It is be understood that if the pedestal controller was accurate in rotating the pedestal at exactly 90° intervals, then the intersection of the lines between $X_1Y_1-X_2Y_2$ and $X_3Y_3-X_4Y_4$ in fact determines the true center of rotation. As is discussed further below, a correction technique is used to minimize the error that might be introduced if the pedestal controller does not in fact rotate the pedestal precisely at 90° intervals. Also, although not shown in the drawings, at this point the operator optically chooses and locates an XY reference center, i.e., the (0,0) coordinate point for the XY table.

Referring now to FIG. 4C, the primary step in the method of teaching the autocalibration eye point signatures are set forth. As illustrated at block 87, the operator first chooses a target point, which can be done very accurately with system optics, and enters the location into the microprocessor memory. As set forth at block 88, the system obtains the $X_1Y_1$ signature of the 0° rotation target, using PRS techniques, and stores this signature. As set forth at block 89, the pedestal is then rotated 90° and the $X_2Y_2$ signature is obtained. These steps may be carried out using either one of two procedures. In one case, the apparatus automatically positions the XY table to the location calculated from the knowledge of the center of rotation, and the PRS obtains the signature. Alternately, the operator uses the manual control knobs to align the XY table so as to locate the chosen target point in the optical cross hairs, and then causes the PRS to obtain the signature. It is to be noted that the $X_2Y_2$ signature is not simply the $X_1Y_1$ signature rotated or translated by 90°, but is different due to the changed light conditions at the new target location. At block 90, it is indicated that the pedestal is rotated an additional 90°, and the $X_3Y_3$ signature is obtained. Finally, the pedstal is rotated another 90°, and the $X_4Y_4$ signature is obtained as shown in block 91. Following this, it is to be noted that the apparatus has in storage four signatures corresponding to four 90° positions, each characteristic of a given point when rotated to the respective different angle. Also, the initial location of the target at the 0 theta position has been saved, for purposes of initiating the recalibration operation at a later time.

Figure 4D:
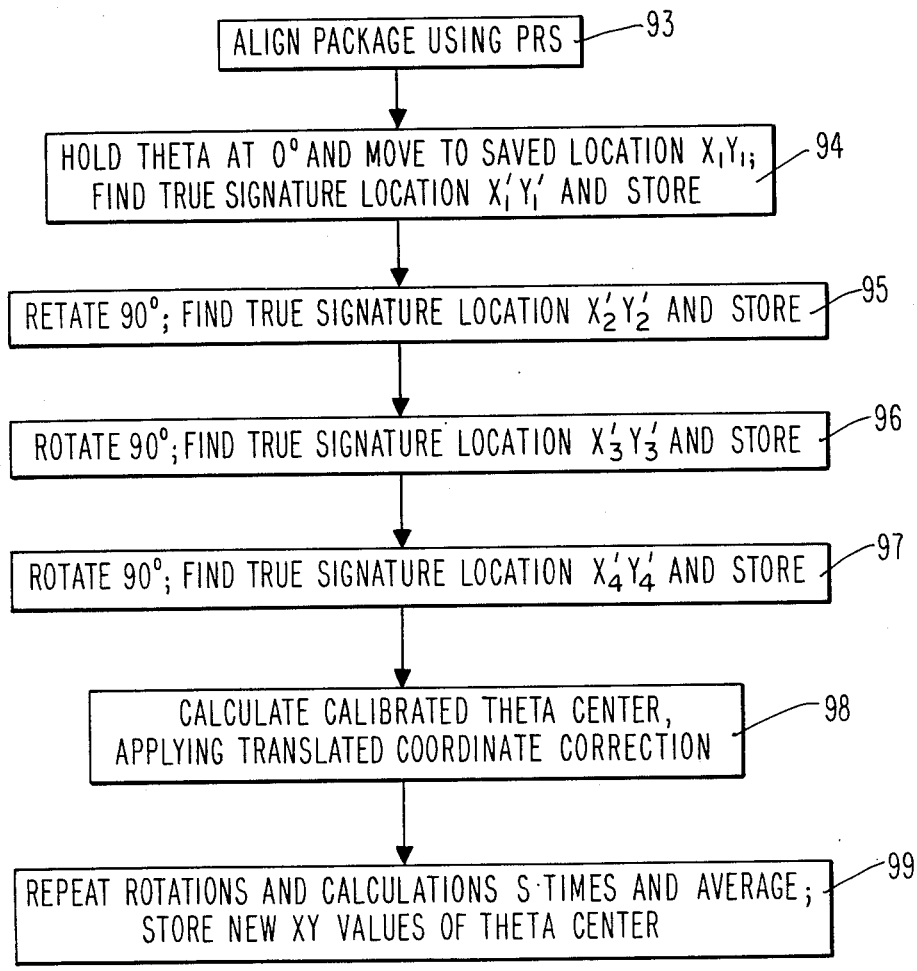
FIG. 4D is a flow diagram of the steps carried out in finding the center of rotation using the automatic theta calibration run mode of this invention.

Referring now to FIG. 4D, there is shown a flow diagram for finding the center of rotation using the automatic theta calibration run mode portion of this invention. This automatic run routine is automatically triggered every N packages, or could be initiated by other means, i.e., having the operator initiate the operation depending upon the observed alignment of the apparatus. As set forth at block 93, the device is first aligned using PRS, so that the apparatus knows the coordinates of the package with respect to its XY and the theta reference system. At block 94, the theta is held at 0 degrees rotation and the XY table is moved to the $X_1Y_1$ location which was saved in memory, as a first step in finding the eye point (chosen target point). Then the PRS finds the signature which was recorded corresponding to the first eye point, and its corresponding location, the finding step utilizing a searching technique as set forth in the aforementioned Berkin et al patent. The searching or finding technique of a PRS system is not limited to the description in the Berkin et al patent, but may be any procedure for looking at and comparing signatures to determine the signature which most closely corresponds to the stored signature. In this manner, the true location $X_1'Y_1'$ of the first eye point is determined and stored. Next, at block 95, the pedestal is rotated 90° and the same steps are followed, the apparatus finding the true signature location $X_2'Y_2'$ of the 90° eye point and storing it. At 96, the pedestal is rotated another 90°, and likewise the true signature location $X_3'Y_3'$ is found and stored. Then, at 97, the pedestal is rotated another 90°, and the fourth location $X_4'Y_4'$ is determined by finding the signature and stored. Thus, after step 97 the original eye point which was picked by the operator in the teach mode has been found at four respective 90° locations, which locations are now known to the microprocessor. At step 98, these four locations are used to calculate a recalibrated theta center. This may be done by determining the mid-points of the diametrically opposed pairs $X_1'Y_1'-X_3'Y_3'$ and $X_2'Y_2'-X_4'Y_4'$. Preferably, in carrying out the calculation step 98, a correction algorithm is followed which is discussed hereinbelow. Following this, optionally at block 99, the procedure of determining the four signature locations and calculating the theta center is repeated S times, and the S calculated centers are averaged. The system then stores the new XY values of the re-calibrated theta center. Following this, as illustrated in FIG. 4A, the apparatus then automatically proceeds to bond additional packages for a period of time, or a predetermined number of packages, until the re-calibration steps are repeated.

Figure 5:
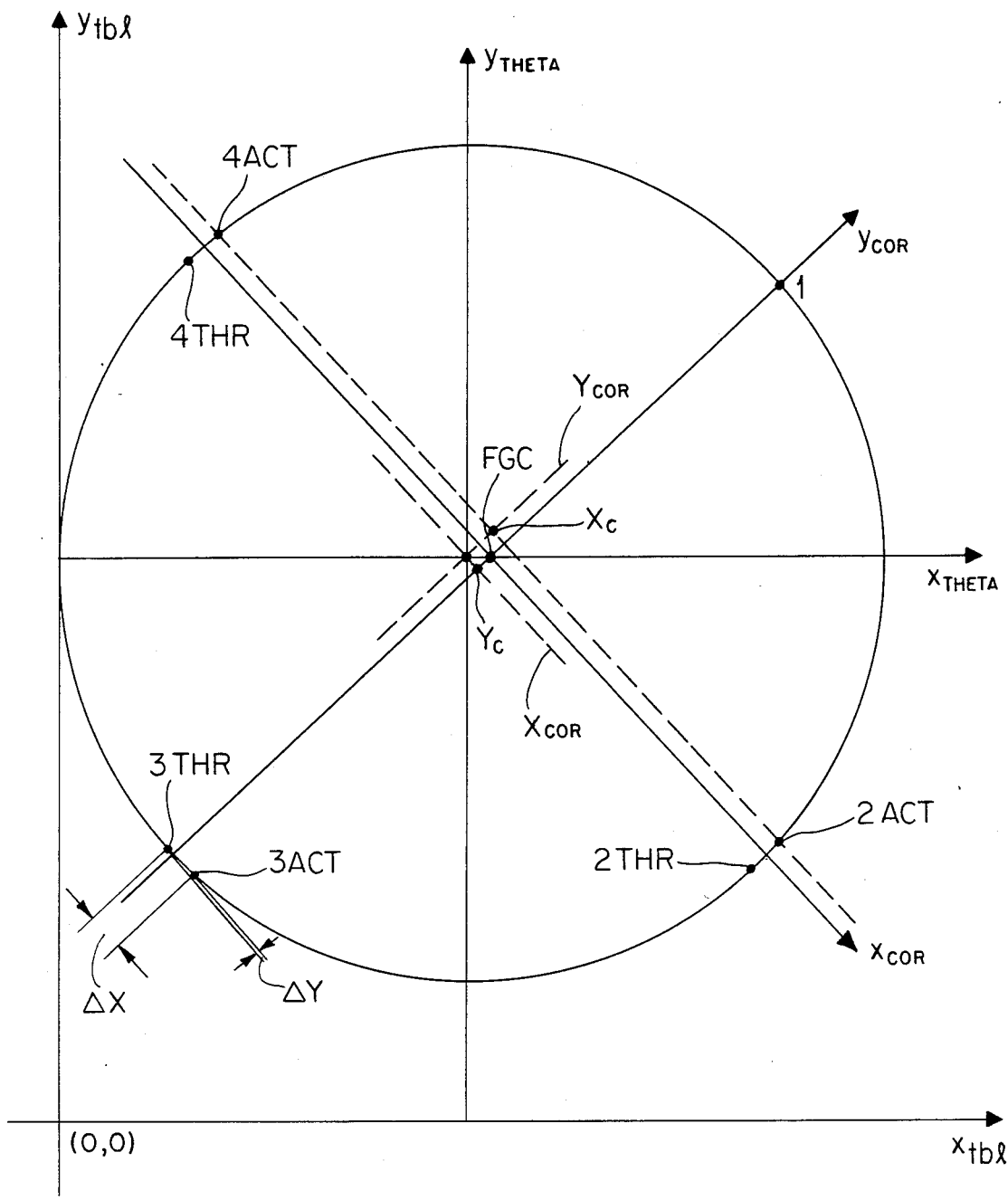
FIG. 5 is a diagram illustrating the technique of calculating the true theta center in a manner to correct for errors in rotation during the re-calibration procedure.

Referring now to FIG. 5, there is shown a diagram illustrating a correction technique that is used for finding the true center of rotation by correcting for possible error where the pedestal is not rotated accurately to the four respective 90° positions. As illustrated in FIG. 5, it is assumed that the first signature is found at point 1. Following this, the pedetal is rotated 90°, and the second signature is in fact found at the point marked 2 ACT. However, to illustrate, it is assumed that had the pedestal been rotated precisely 90°, the signature would have been found at 2 THR, which would be the theoretically correct position had no rotation error been introduced in the procedure. Likewise, at positions 3 and 4 there are shown 3 ACT and 3 THR and 4 ACT and 4 THR, respectively. Also, the first guess center, FGC, is shown as being the four point average of the four points actually found, i.e., 1 ACT-4 ACT. The correction technique of this invention is based upon the observation that for diametrically opposite points the potential rotation error introduces relatively little error in the calculated mid-point on a line between the two opposite points. Thus, considering points 1 and 3, the placement error $\Delta Y$ due to theta error on a line connecting points 1 and 3 is very small, although the error $\Delta X$ in the orthogonal direction could be significant. The same observation is, of course, the same for any error introduced at points 2 and 4.

The above observation is utilized in constructing a translated coordinate system comprising axes $x_{cor}$ and $y_{cor}$. The first step in generating the correction reference system is to draw a dashed line between two opposite pairs, i.e., 2 ACT and 4 ACT, as illustrated. Following this, a line having the same slope is drawn through the first guess center FCG, which line is designated $x_{cor}$. Then a line $y_{cor}$ is drawn through FCG and orthogonal to $x_{cor}$, as indicated. These two axes then define a new or translated reference system. Looking at $x_{cor}$, the mid-point $X_C$ is determined. The line $Y_{COR}$ is drawn parallel to the $y_{cor}$ axis and through $X_C$, and is the corrected Y axis for the translated system. Then, the same procedure is followed for the translated Y axis, and a mid-point $Y_C$ is found which represents the true Y location in the translated reference system. A shifted $X_{COR}$ axis is drawn through $Y_C$, to indicate a corrected translated X axis. The intersection of $Y_{COR}$ and $X_{COR}$ is the calculated true center. This point is the center of the theta reference system, and has a corresponding XY value in the XY table reference system.

There has been disclosed a preferred embodiment of an apparatus and method for re-calibrating the center of rotation of a rotatable pedestal, in the specific environment of a wedge type bonding system. It is to be understood that the invention is not limited in scope to such systems, and may advantageously be used in other systems, i.e., any system where pattern recognition is employed and it is important to track the true center of rotation (within the system reference system) of a rotatable element

We claim:

1. A calibration correction method for operatorless operation of a wedge wire bonding apparatus having a pattern recognition system (PRS) for generating signatures, the method being used to determine the center of rotation of a pedestal which carries a package to be wire bonded, comprising:
   (a) generating and storing, in a teach operation, a plurality of signatures each representing a pre-determined point on said package at respective different pedestal angles, and;
   (b) automatically performing the following steps in a run operation;
      (i) rotating said pedestal to each of said angles, finding each of said signatures at each respective angle, and storing the location of each respective found signature, and
      (ii) calculating the center of rotation of said pedestal from said found and stored signature locations.

2. The method as described in claim 1, wherein said teach operation comprises obtaining four signatures at about respective 90° pedestal angles.

3. The method as described in claim 1, wherein said teach operation comprises initially finding and recording the center of rotation of said pedestal, and after every N packages bonded, again carrying out said rotating and calculating steps and recording a corrected center of rotation of said pedestal.

4. The method as described in claim 3, wherein said intially finding step comprises initially rotating said pedestal to respective 90° positions and finding the location of a predetermined point on said package at each of said initial positions, and initially calculating said initial center of rotation as a function of said initial positions.

5. The method as described in claim 4, wherein said initially calculating step comprises carrying out a correcting algorithm to correct for error in said initially rotating step.

6. The method as described in claim 1, wherein said package includes a chip mounted in a lead frame, and wherein said obtaining step comprises obtaining said signatures to represent a point on said chip.

7. The method as described in claim 1, wherein said calculating step comprises carrying out a correcting algorithm to correct for error in said rotating step.

8. In a wire bonding apparatus which incorporates a pattern recognition system for generating signatures and a rotatable pedestal for carrying a package to be wire bonded, said apparatus having a system reference, a method of automatically determining the center of rotation of said pedestal with respect to said system reference after a period of operation of said apparatus, comprising
   initially determining the pedestal center of rotation with said pedestal at a first angle and storing same,
   choosing a point on said package and obtaining and storing a first signature for said point;
   rotating said pedestal to angles of 90°, 180° and 270° relative to said first angle and obtaining and storing second, third and fourth signatures for said point corresponding to said 90°, 180° and 270° angles, thereby accumulating four 90° interval signatures;
   automatically running packages and performing bonding operations on each of said packages, utilizing the stored center of rotation;
   every N packages, automatically re-calibrating the center of rotation and storing a newly determined center of rotation, said re-calibrating including finding said first signature and automatically; determining its corresponding position; rotating said pedestal 90° and finding said second signature and determining its corresponding position; rotating said pedestal another 90° and finding said third signature and determining its corresponding position and rotating said pedestal another 90°; and, finding said fourth signature and determining its corresponding position, and
   automatically calculating the pedestal center of rotation as a function of said four determined positions.

9. The method as described in claim 8, wherein said calculating step comprises determining the mid-points between 180° opposite pairs of said determined positions and averaging said mid-points.

10. The method as described in claim 8, wherein said calculating step comprises carrying out a correcting algorithm to correct for error in the re-calibrating rotating steps.

11. Wedge wire bonding apparatus, said apparatus having a pedestal for carrying a package through predetermined angles, a pattern recognition system for generating signatures, and bonding means for carrying out pre-determined bonding operations; said apparatus further having auto calibration means for automatically re-calibrating the pedestal center of rotation, said auto calibration means comprising:
   storage means for storing a plurality of respective signatures obtained by said pattern recongition system and each representing a pre-determined point on said package at respective pedestal angles,
   rotation means for automatically rotating said pedestal to about said respective angles,
   finding means for automatically finding at each of said angles the signature corresponding to the stored signature for each said angle and automatically determining the location of each said found signature, and
   calculating means for automatically calculating the center of rotation of said pedestal as a function of said determined locations.

12. The apparatus as described in claim 11, further comprising feeding means for feeding and positioning individual packages on said pedestal for wire bonding, and initiating means for cyclically initiating operation of said auto calibrations means.

13. The apparatus as described in claim 12, wherein said initiating means comprises count means for counting packages bonded and for causing said initiating means to initiate operation of said auto calibration means every N packages.

14. The apparatus as described in claim 11, wherein said apparatus comprises PRS teach control means for controlling said pattern recognition system to generate said plurality of signatures.

15. The apparatus as described in claim 14, wherein said PRS teach control means further controls said pattern recognition system to generate said plurality of signatures at respective 90° rotational positions.

16. The apparatus as described in claim 14, wherein said package comprises a chip mounted in a lead frame, and said teach control means controls said pattern recognition system to generate said signatures corresponding to a specific eye point on said chip.

17. The apparatus as described in claim 11, wherein said calculating means comprises correction means for carrying out a correction algorithm to minimize any error in operation of said rotation means.

18. Apparatus for performing pre-determined operations at specific locations on a series of like electronics packages, the apparatus having a pattern recognition system for generating signatures with means for determining the location of any point on one of said packages within a reference coordinate system, the apparatus also having a rotatable element for carrying and rotating a said package through controllable angles, said apparatus further having auto calibration means for automatically re-calibrating the pedestal center of rotation, said auto calibration means comprising:

storage means for storing a plurality of signatures representing a pre-determined point on a said package at respective pedestal angles, finding means for automatically finding on one of said packages signatures corresponding to each of said stored signatures and automatically determining the location of each said found signatures, and calculating means for automatically calculating the center of rotation of said pedestal as a function of said determined locations.

* * * * *